United States Patent
Boardman et al.

(10) Patent No.: US 11,626,534 B2
(45) Date of Patent: Apr. 11, 2023

(54) UV PATTERNABLE MATRIX CONTAINING BLUE LIGHT EMITTING QUANTUM DOTS

(71) Applicant: SHARP KABUSHIKI KAISHA, Osaka (JP)

(72) Inventors: Edward Andrew Boardman, Abingdon (GB); Enrico Angioni, Didcot (GB); Tim Michael Smeeton, Oxford (GB)

(73) Assignee: SHARP KABUSHIKI KAISHA, Sakai (JP)

(*) Notice: Subject to any disclaimer, the term of this patent is extended or adjusted under 35 U.S.C. 154(b) by 38 days.

(21) Appl. No.: 17/341,612

(22) Filed: Jun. 8, 2021

(65) Prior Publication Data
US 2022/0393061 A1 Dec. 8, 2022

(51) Int. Cl.
*H01L 33/06* (2010.01)
*H01L 27/32* (2006.01)
*H01L 27/15* (2006.01)

(52) U.S. Cl.
CPC ............ *H01L 33/06* (2013.01); *H01L 27/153* (2013.01); *H01L 27/3246* (2013.01)

(58) Field of Classification Search
CPC .... H01L 33/06; H01L 27/153; H01L 27/3246
See application file for complete search history.

(56) References Cited

U.S. PATENT DOCUMENTS

| | | | |
|---|---|---|---|
| 9,548,331 B2 | 1/2017 | Cai | |
| 10,018,912 B2 | 7/2018 | Kamura et al. | |
| 10,224,483 B2 | 3/2019 | Li et al. | |
| 10,509,319 B2 | 12/2019 | Suzuki et al. | |
| 10,581,007 B2 | 3/2020 | Angioni et al. | |
| 2007/0103069 A1* | 5/2007 | Manuela | H05B 33/04 313/512 |
| 2017/0194382 A1 | 7/2017 | Lee et al. | |
| 2018/0102449 A1 | 4/2018 | Pschenitzka et al. | |
| 2018/0149970 A1 | 5/2018 | Lee et al. | |
| 2019/0212610 A1 | 7/2019 | Kim et al. | |
| 2019/0280231 A1 | 9/2019 | Kim et al. | |

FOREIGN PATENT DOCUMENTS

| | | | | |
|---|---|---|---|---|
| CN | 104317128 A | * | 1/2015 | ........... G02F 1/1333 |
| CN | 105301827 A | * | 2/2016 | ....... G02F 1/133617 |
| CN | 110620134 A | | 12/2019 | |
| CN | 106604937 B | | 1/2020 | |
| JP | 2008089708 A | * | 4/2008 | |
| WO | WO-2014024068 A2 | * | 2/2014 | ............. B82Y 20/00 |

* cited by examiner

*Primary Examiner* — Peter Bradford
(74) *Attorney, Agent, or Firm* — ScienBiziP, P.C.

(57) ABSTRACT

A quantum dot LED display apparatus includes a substrate having a plurality of banks deposited thereon. A plurality of red emitting LED sub-pixels, green emitting LED sub-pixels, and blue emitting LED sub-pixels are individually disposed between the banks. Each of the red emitting LED sub-pixels, green emitting LED sub-pixels, and blue emitting LED sub-pixels has an emissive layer, wherein each of the emissive layers comprises quantum dots, an organic matrix, and a photoinitiator. A first concentration of the photoinitiator in the blue emitting LED sub-pixels is lower than a second concentration of the photoinitiator in the red emitting LED sub-pixels, and lower than a third concentration of the photoinitiator in the green emitting LED sub-pixels.

16 Claims, 8 Drawing Sheets

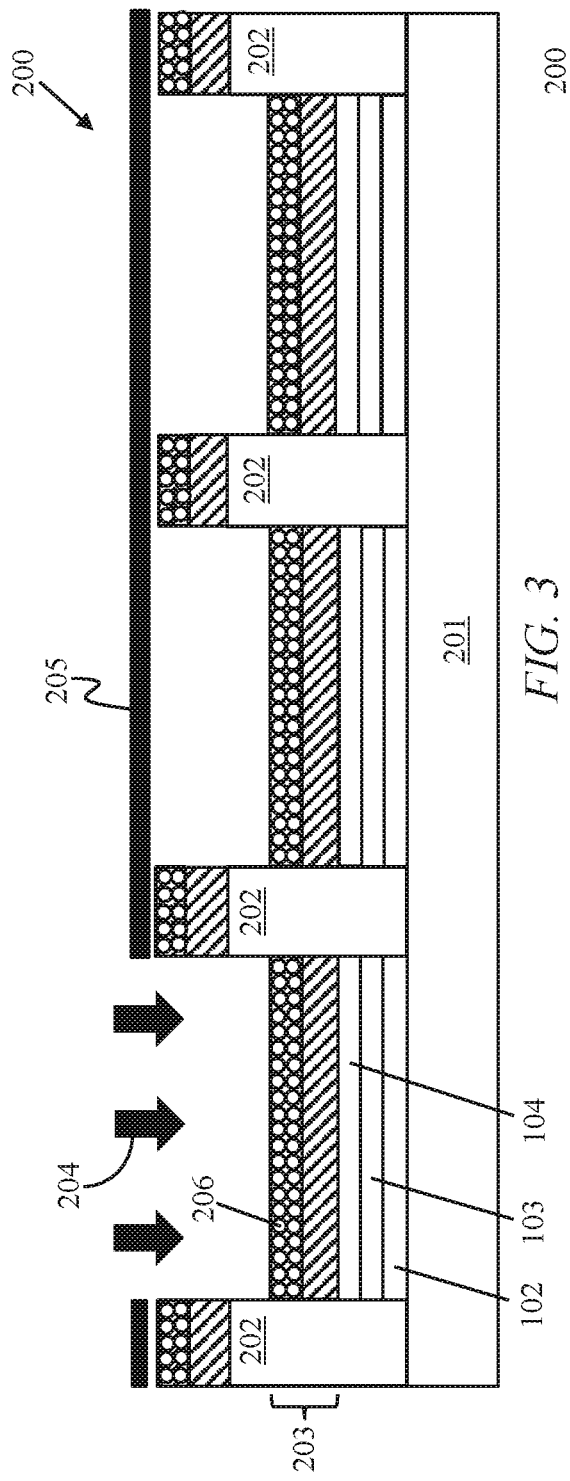
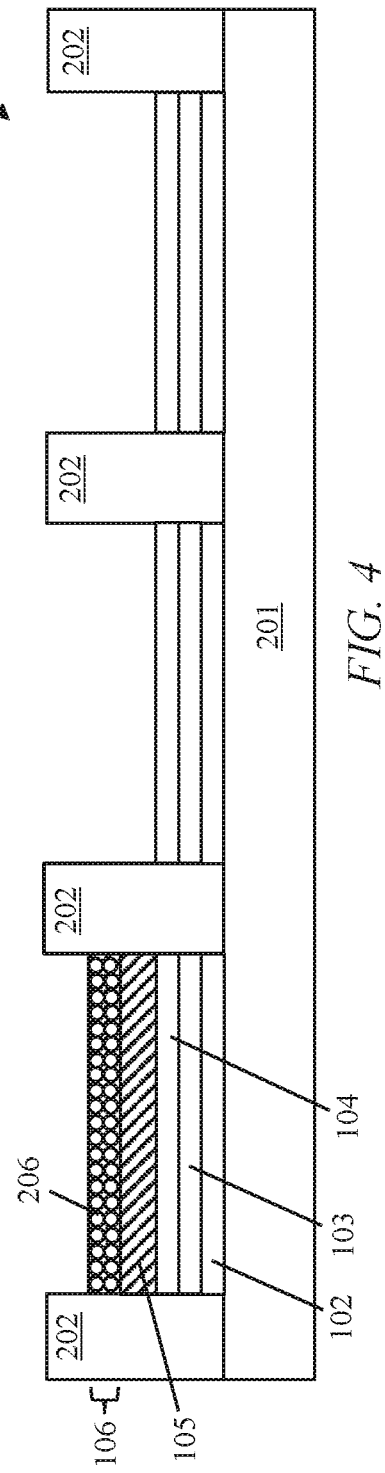

UV PATTERNABLE MATRIX CONTAINING BLUE LIGHT EMITTING QUANTUM DOTS

FIELD

This invention relates to an emissive layer within a quantum dot LED which emits blue light and can be spatially patterned by exposure to ultra-violet light or near ultra-violet light. The resulting quantum dot LED may be used as the blue sub-pixel in a display device.

BACKGROUND

Several ways of using red, green, and blue quantum dot LEDs as the sub-pixels in a display device are known. For example, electroluminescent quantum dot LEDs may be patterned to form the R, G, B sub-pixels in a wide color gamut display device. One method of creating a patterned emissive layer is to use ink-jet printing. A quantum dot ink formulation may be used to form light emitting layers by depositing the ink into a desired location. The ink may be heated to remove the solvent and then dried to leave a solid quantum dot layer.

Another method for spatial patterning of quantum dots is to use photolithography. A photosensitive mixture including a nanosized fluorescent material, such as quantum dots, may be patterned by exposure to light to form a color conversion film. Numerous other examples of such color conversion films exist, and may have additional features, such as light scattering particles or antioxidants that may be used in combination with an LCD or an OLED display. There are also methods detailing the steps of creating a color conversion film by photolithography with either a positive or negative quantum dot photoresist.

Direct patterning of a quantum dot LED emissive layer for electroluminescent devices by photolithography is less well known, but examples exist. Quantum dots may be used with cross-linkable ligands which are sensitive to ultraviolet light. Also, an emissive layer for a quantum dot LED may include quantum dots in a charge transporting matrix which is cross-linked by exposure to ultraviolet light.

During photolithography a residual film may remain in developed areas which have not been directly exposed to UV light during the lithography process. One approach to reduce the residual film remaining is to change the composition of the liquid used to deposit quantum dot photoresist. Another approach is to use a black light-absorbing material for the pixel defining layer (e.g., the "bank") to reduce the effect of scattered UV light during the curing process.

SUMMARY

A quantum dot light emitting diode (LED) display apparatus includes a substrate having a plurality of banks deposited thereon. A plurality of red emitting LED sub-pixels, green emitting LED sub-pixels, and blue emitting LED sub-pixels are individually disposed between the banks. Each of the red emitting LED sub-pixels, green emitting LED sub-pixels, and blue emitting LED sub-pixels has an emissive layer, and each of the emissive layers comprises quantum dots, an organic matrix, and a photoinitiator. A first concentration of the photoinitiator in the blue emitting LED sub-pixel emissive layers is lower than a second concentration of the photoinitiator in the red emitting LED sub-pixel emissive layers, and lower than a third concentration of the photoinitiator in the green emitting LED sub-pixel emissive layers.

In the quantum dot LED display apparatus, the photoinitiator in the blue emitting LED sub-pixels may have a lower absorption coefficient for blue light, with a wavelength between 400 nm and 500 nm, than the photoinitiator in the red emitting LED sub-pixels and the photoinitiator in the green emitting LED sub-pixels. Additionally, an absorption wavelength of the photoinitiator in the blue emitting LED sub-pixels may be in an ultraviolet wavelength range of 200 nm to 400 nm.

The quantum dots in the blue emitting LED sub-pixels may have the same or a greater surface area relative to the quantum dots in the green emitting LED sub-pixels. The quantum dots in the blue emitting LED sub-pixels may comprise a core of $Cd_xZn_{1-x}Se$ ($0 \leq x < 1$) or $ZnSe_yTe_{1-y}$ ($0 < y \leq 1$). The quantum dots in the blue emitting LED sub-pixels may comprise a shell of $Cd_xZn_{1-x}Se_yS_{1-y}$ ($0 \leq x \leq 1$; $0 \leq y < 1$). The organic matrix may comprise a cross-linked charge transport material.

The quantum dot LED display apparatus may comprise one or more second electrodes forming a continuous layer common to all of the red emitting LED sub-pixels, the green emitting LED sub-pixels, and the blue emitting LED sub-pixels. It may also comprise a plurality of one or more first charge transport layers in the red emitting LED sub-pixels, the green emitting LED sub-pixels, and the blue emitting LED sub-pixels. The one or more first charge transport layers in the red emitting LED sub-pixels, the one or more first charge transport layers in the green emitting LED sub-pixels, and the one or more first charge transport layers in the blue emitting LED sub-pixels may have different thicknesses.

The quantum dot LED display apparatus may comprise one or more second charge transport layers disposed over the emissive layers. The one or more second charge transport layers may be common to all of the red emitting LED sub-pixels, the green emitting LED sub-pixels, and the blue emitting LED sub-pixels. The quantum dot LED display apparatus may also comprise a reflector between the substrate and a plurality of first electrodes, wherein one or more second electrodes are partially transmissive, and the apparatus emits light through the one or more second electrodes.

The one or more second electrodes may be common to all of the red emitting LED sub-pixels, the green emitting LED sub-pixels, and the blue emitting LED sub-pixels. The quantum dot LED display apparatus may also comprise a plurality of partially transmissive first electrodes, one or more reflective second electrodes, wherein the apparatus emits light through the substrate. In that implementation, the one or more reflective second electrodes may be common to all of the red emitting LED sub-pixels, the green emitting LED sub-pixels, and the blue emitting LED sub-pixels.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

FIG. 3 illustrates a cut-away view of a photolithography step for forming an emissive layer of a QLED.

FIG. 4 illustrates a cut-away view of an emissive layer and other structures resulting from the photolithography process of FIG. 3.

DETAILED DESCRIPTION

Figure 1:
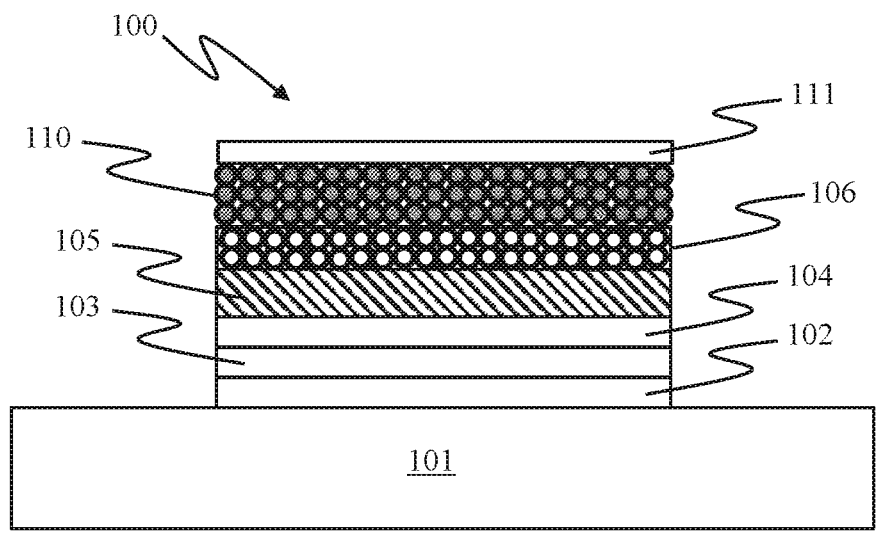
FIG. 1 illustrates a cut-away view of a QLED apparatus.

The following description contains specific information pertaining to exemplary implementations of the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale and are not intended to correspond to actual relative dimensions.

For consistency and ease of understanding, like features are identified (although, in some examples, not shown) by numerals in the exemplary figures. However, the features in different implementations may differ in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates an open-ended inclusion or membership in the so-described combination, group, series and the equivalent.

Additionally, for purposes of explanation and non-limitation, specific details, such as functional entities, techniques, protocols, standards, and the like are set forth for providing an understanding of the described technology. In other examples, detailed description of well-known methods, technologies, systems, architectures, and the like are omitted so as not to obscure the description with unnecessary details.

The present disclosure concerns a structure and materials for the emissive layers of an electroluminescent quantum dot LED (alternatively known as, for example, a "QLED", "QD-LED" or "EL-QD") display containing red, green, and blue sub-pixels (hereinafter "QLED"). These emissive layers may be patterned by exposure to specific wavelengths of light as part of a photolithography process.

The emissive layers discussed herein may be used as the emissive layer of a typical QLED structure, which is described as follows: a first electrode disposed on a substrate, a second electrode disposed opposite the first electrode, and an emissive layer containing quantum dots disposed between the first and second electrodes. A bias applied across the electrodes causes a first charge carrier (e.g., holes) to be injected into the emissive layer from the first electrode and an opposite charge carrier (e.g., electrons) to be injected into the emissive layer from the second electrode. These charge carriers recombine in the quantum dots of the emissive layer, resulting in light being emitted from the QLED. Additional layers, such as charge injection layers, charge transport layers or charge blocking layers may be disposed between the emissive layer and an electrode.

A QLED display may include multiple QLEDs with emissive layers configured to emit either red, green or blue light under applied bias disposed on a shared substrate and separated by an inert pixel defining layer ("bank"). In such a case, each QLED is a sub-pixel of the display. One or more of the layers of the QLEDs may be common to all the QLEDs of a display while other layers may be patterned such that they are specific to an individual QLED. For example, the first electrode may be patterned and the second electrode common, thereby allowing individual sub-pixels to emit different amounts of light by individually controlling the voltage applied to the first electrode of each sub-pixel and keeping the second electrode at a fixed potential.

To configure an emissive layer to emit different wavelengths of light according to its position, a patterning process is required. For example, inkjet printing or photolithography may be used. Ink jet printing advantageously deposits material only in the sub-pixels where it is required, reducing the total amount of material used. However, the resolution of ink-jet printing is limited by the size of the droplets which can be produced during the printing process. Therefore, for high resolution displays, a photolithography process may be preferred.

In a photolithography process, a photoresist is deposited over an area of interest. It is subsequently patterned by exposure to light (e.g., UV light) through a mask which contains one or more apertures. A chemical reaction occurs in the photoresist in response to the application of light. The molecule which initiates this reaction is known as a photoinitiator. In a "positive" process, the photoresist which has been exposed to light becomes soluble in a developer while the photoresist which has not been exposed is insoluble in the developer. Conversely, in a "negative" process photoresist which has been exposed to light becomes insoluble in a developer while photoresist which has not been exposed to light is soluble in the developer. There may be a number of other steps as part of the photolithography process, such as pre-exposure annealing and post-exposure annealing.

For a QLED display, a photoresist containing quantum dots which emit red light under electrical excitation is deposited over the active area of the display and patterned such that after development the red emissive layer is not present in the green or blue sub-pixels. This process is repeated with a second photoresist containing green quantum dots and patterned such that the green emissive layer is not present in the red or blue sub-pixels. The process is repeated again with a third photoresist containing blue quantum dots and patterned such that the blue emissive layer is not present in the red or green sub-pixels. The order of the patterning steps may be changed, and it should be understood that the red, green and blue patterning steps do not have to follow the order presented here.

A desirable property in a display is high color purity, which enables a wide color gamut. This corresponds to the light emitted from an individual sub-pixel having a narrow spectrum and the spectra emitted from each sub-pixel of the same color being uniform in profile. QLEDs are known to be capable of emitting light with a narrow emission spectrum. However, in a display device made using photolithography it is important that all soluble quantum dot material is removed during the development process. Any remaining quantum dots may emit light of an undesirable wavelength and reduce the color purity of the display. For example, red quantum dots may remain in a green sub-pixel, resulting in both green light and unwanted red light being emitted from the green sub-pixel during operation.

In particular, unwanted photoresist may remain during the patterning process for the emissive layer which contains blue quantum dots. The light used during photolithography is typically ultraviolet light, to which the photoinitiator is sensitive and efficiently initiates the chemical reaction. The sensitivity of a photoinitiator typically decreases as wavelength increases, but many photoinitiators still exhibit a sensitivity to blue light. During exposure, the ultraviolet light incident on the photoresist may be absorbed by the blue quantum dots instead of the photoinitiator and then re-emitted as blue light via photoluminescence. This blue light may be re-emitted in any direction, and therefore a substantial amount of this light will propagate in the plane of the emissive layer (e.g., perpendicular to the direction of UV irradiation), trapped by total internal reflection. The absorption coefficient for blue light by both the photoinitiator and the quantum dots will be lower than for ultraviolet light and therefore this blue light may propagate a comparatively large distance from where it was generated before being absorbed, e.g., in an adjacent sub-pixel. If the blue light is reabsorbed by the photoinitiator then the chemical reaction may be initiated in unintended and undesirable areas, resulting in blue quantum dots being present in the red or green sub-pixels.

While photoluminescence from red and green quantum dots will occur during the photolithography process, the effect on the patterning process will be significantly lower because of the even lower absorption of longer wavelength light by the photoinitiator. Furthermore, the lower energy of the longer wavelength light may be insufficient to initiate the chemical reaction at all.

In one implementation of the present disclosure, the concentration of photoinitiator in the photoresist containing blue quantum dots is lower than the concentration of photoinitiator in the red and green photoresists. This advantageously decreases the sensitivity to the re-emitted blue light from the quantum dots of the portions of the photoresist which are not directly exposed.

In another implementation of the disclosure, a photoinitiator is used which has reduced sensitivity to visible wavelengths of light. The reduced sensitivity may be due to a lower absorption coefficient of the photoinitiator in the blue part of the spectrum. The reduced sensitivity may be due to a reduced amount of the blue light contributing to the initiation of the chemical reaction. For example, the absorbed blue light may instead be re-emitted as light with a longer wavelength or lost as heat. The reduced sensitivity of the photoinitiator advantageously decreases the sensitivity to the re-emitted blue light from the quantum dots of the portions of the photoresist which are not directly exposed.

Reducing the absorption coefficient of the photoinitiator to blue light may also reduce the absorption coefficient of the photoinitiator to ultraviolet light. This may be compensated for by decreasing the wavelength of light used during the exposure step of the photolithography process, e.g., using a shorter wavelength of ultraviolet light. This advantageously reduces processing time, which is desirable during a manufacturing process to increase throughput.

In yet another implementation of the disclosure, the photoresist for the blue sub-pixel contains large quantum dots. The emission wavelength of the quantum dots is defined by the material and the size of the quantum dot core. Therefore, the shell thickness may be increased without affecting the wavelength of light, which is emitted from the quantum dot, and therefore from the QLED display device. For a given concentration (by mass) of quantum dots in the photoresist, the relative surface area of quantum dots is larger when the volume of quantum dots is smaller. The surface of the quantum dots is capped with organic ligands to passivate the surface and reduce non-radiative recombination, which increases the efficiency of the QLED and therefore the display device. These ligands may interfere with the chemical reaction of the photolithography process. Therefore, by increasing the surface area of the quantum dots, and hence the number of ligands, in the photoresist, crosslinking may be advantageously prevented in areas which are not directly exposed during the photolithography process.

These implementations may be used individually or in any combination to realize a QLED display manufactured using a photolithography process with high color purity and low blue light emission from the red and green sub-pixels.

Referring to FIG. 1, a quantum dot LED (QLED) 100 is shown. A reflector 102 is disposed on a substrate 101. In one implementation, the reflector 102 has a reflectivity of greater than 80% at the wavelength of light emitted by the QLED 100. In another implementation, the reflector 102 has a reflectivity of greater than 90% at the wavelength of the QLED 100. 100 nm aluminum and 100 nm silver are examples of suitable materials and thicknesses for the reflector 102. An anode 103 is disposed on the reflector 102. In one implementation, 10 nm indium tin oxide (ITO) may be used as the anode 103. Alternatively, the metal reflector 102 may be used as the anode 103.

A hole injection layer 104 is disposed on the anode 103. 40 nm PEDOT:PSS is an example of a suitable hole injection layer 104 material. A hole transport layer 105 and an emissive layer 106 are disposed over the hole injection layer 104 by solution processing using a photoresist (not shown). The photoresist includes a solution mixture of a hole transport material, quantum dots 107 (FIG. 2), and a photoinitiator together with a solvent. The solution is deposited onto the hole injection layer 104 (for example, by spin coating), heated on a hot plate, exposed to ultraviolet light, and heated again to form the layers. During the spin coating process, the quantum dots 107 phase-separate from the hole transport material, producing the lower hole transport layer 105 and the upper emissive layer 106.

Figure 2:
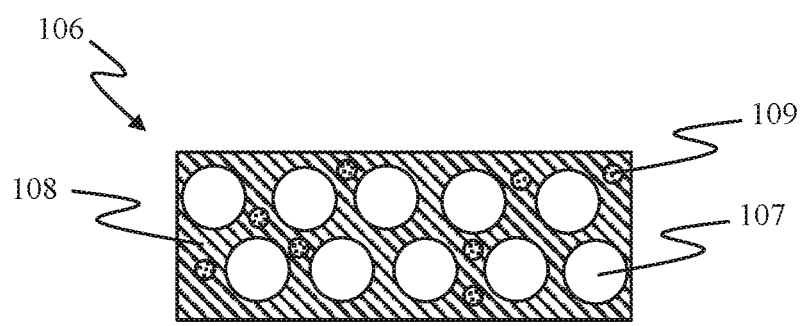
FIG. 2 illustrates a QLED emissive layer with quantum dots in an organic matrix, formed by photolithography.

Referring to FIG. 2, the emissive layer 106 is shown in detail. The emissive layer 106 contains quantum dots 107 within a matrix of hole transport material 108 and a quantity of photoinitiator 109. Suitable materials include: OTPD for the hole transport material 108, core-shell InP, CdSe and ZnSe quantum dots 107, and OPPI for the photoinitiator 109 in the photoresist.

Referring again to FIG. 1, an electron transport layer 110 is disposed on the emissive layer 106. 60 nm of zinc oxide nanoparticles is an example of a suitable electron transport layer 110. A partially transparent cathode 111 is disposed on the electron transport layer 110. In one implementation the cathode 111 has a transmissivity of greater than 20%. In another implementation the cathode 111 has a transmissivity of greater than 40%. 15 nm silver and 15 nm $Mg_{0.1}Ag_{0.9}$ are examples of suitable materials and thicknesses for the cathode 111.

The hole injection layer 104 and electron transport layer 110 may be deposited from solution, such as by spin coating, slot-dye coating or ink-jet printing. The reflector 102, anode 103 and cathode 111 may be deposited by techniques such as sputter coating or thermal evaporation.

When an electrical bias is applied between the anode 103 and the cathode 111, light is emitted by the quantum dots 107 (FIG. 2) in the emissive layer 106. Light which is emitted towards the cathode 111 may be transmitted through the partially transparent cathode 111 and observed by an external viewer. Light which is emitted towards the anode 103 may be reflected by the reflector 102 and directed towards the cathode 111.

The above example produces a top-emitting QLED 100 with a conventional layer structure. It should be recognized that the reflector 102 may be removed and the cathode 111 made reflective to produce a bottom-emitting QLED (not shown). It should be recognized that the layer structure may be reversed, with the cathode 111 closest to the reflector 102 and light emitted through the anode 103, producing an inverted QLED (not shown). The apparatus described herein is equally applicable to any of these QLED architectures.

Figure 5:
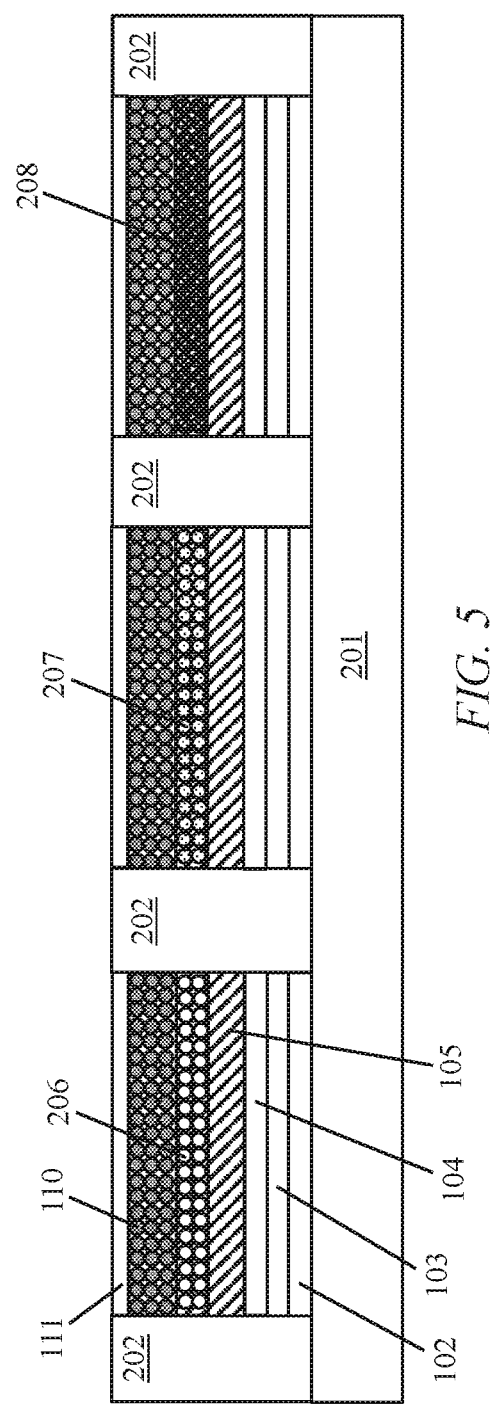
FIG. 5 illustrates a cut-away view of a QLED display device having red, green and blue sub-pixels.

Referring to FIGS. 3, 4, and 5, certain fabrication steps of a QLED display device 200 are shown. A hole injection layer 104 is deposited over an anode layer 103, which is deposited over reflector layers 102, all separated by banks 202. These layers have been deposited on a backplane substrate 201 containing thin film transistors (TFTs), electrically connected to the anode layers 103. A first photoresist layer 203 is deposited over the hole injection layer 104 and extends across the banks 202. In one exemplary photolithography process, the photoresist layer 203 includes InP quantum dots 206 which emit red light. Referring to FIG. 3, a portion of the photoresist layer 203 is exposed to ultraviolet (UV) light 204 through a mask 205.

Referring to FIG. 4, developer (not shown) has been applied to the emissive layer 106, thereby removing the photoresist layer 203 (FIG. 3) which has not been exposed to ultraviolet light, as shown in FIG. 3. This process is repeated (not shown) with a second photoresist layer which includes, for example, InP quantum dots 207 (FIG. 5) which emit green light, with the mask 205 (FIG. 3) offset to expose a different region of the substrate to UV light 204 (FIG. 3). This process is repeated again (not shown) with a third photoresist layer which includes, for example, ZnSe quantum dots 208 (FIG. 5) which emit blue light, with the mask 205 (FIG. 3) offset to expose a different region of the substrate to the UV light 204 (FIG. 3). The remaining layers (electron transport layer 110, cathode layer 111) as described with reference to FIG. 1 are then disposed on the resulting emissive layers 106 containing quantum dots 206, 207, 208, yielding the QLED 200 display device structure as shown in cross-section in FIG. 5.

Figure 6:
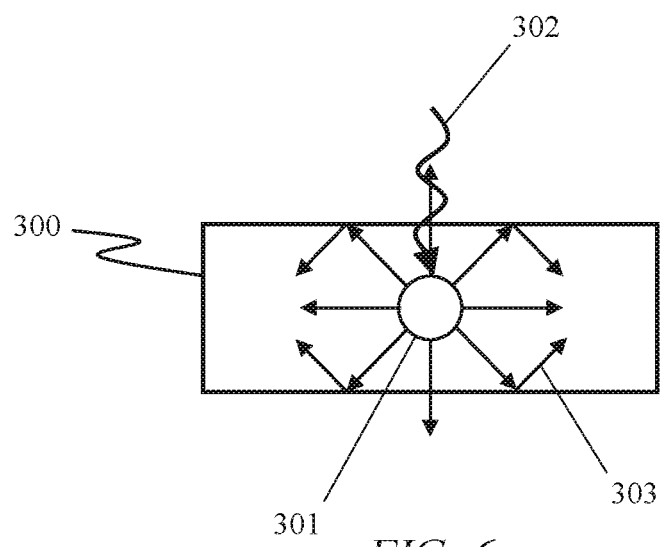
FIG. 6 illustrates the photoluminescence emission properties of a quantum dot in an organic layer when irradiated with ultraviolet light, in accordance with an exemplary implementation of the present disclosure.
Figure 7:
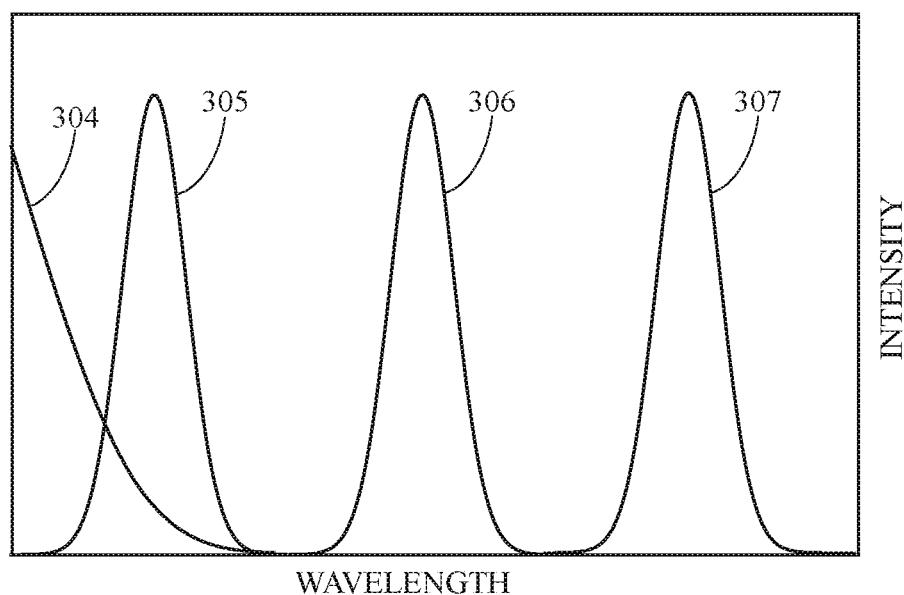
FIG. 7 illustrates a graph of a photoinitiator absorption coefficient comparing the wavelengths of blue, red, and green quantum dot photoluminescence, in accordance with an exemplary implementation of the present disclosure.

Referring to FIGS. 6 and 7, the photoluminescence emission characteristics of a quantum dot 301 in an emissive layer 300 is shown when irradiated with a UV light 302, along with a comparison of a photoinitiator absorption spectrum with the photoluminescence emission wavelengths from blue quantum dots (e.g., blue light 305), green quantum dots (e.g., green light 306), and red quantum dots (e.g., red light 307). FIG. 6 illustrates an emissive layer 300 including a quantum dot 301 (not to scale) being irradiated by a UV light 204 during the exposure step of the photolithography process. The UV light 302 is absorbed and re-emitted by the quantum dot 301 in all directions by photoluminescence 303. Some of this light will propagate in the plane of the layers as shown.

Referring to FIG. 7, in the case of blue light 305, in an instance where the emission spectrum of the quantum dot 301 (FIG. 6), e.g., quantum dots, includes wavelengths of light which the photoinitiator absorbs (e.g., are in the photoinitiator absorption coefficient 304) the QLED may appear as in FIG. 8 (discussed below) after the photolithography process.

Figure 8:
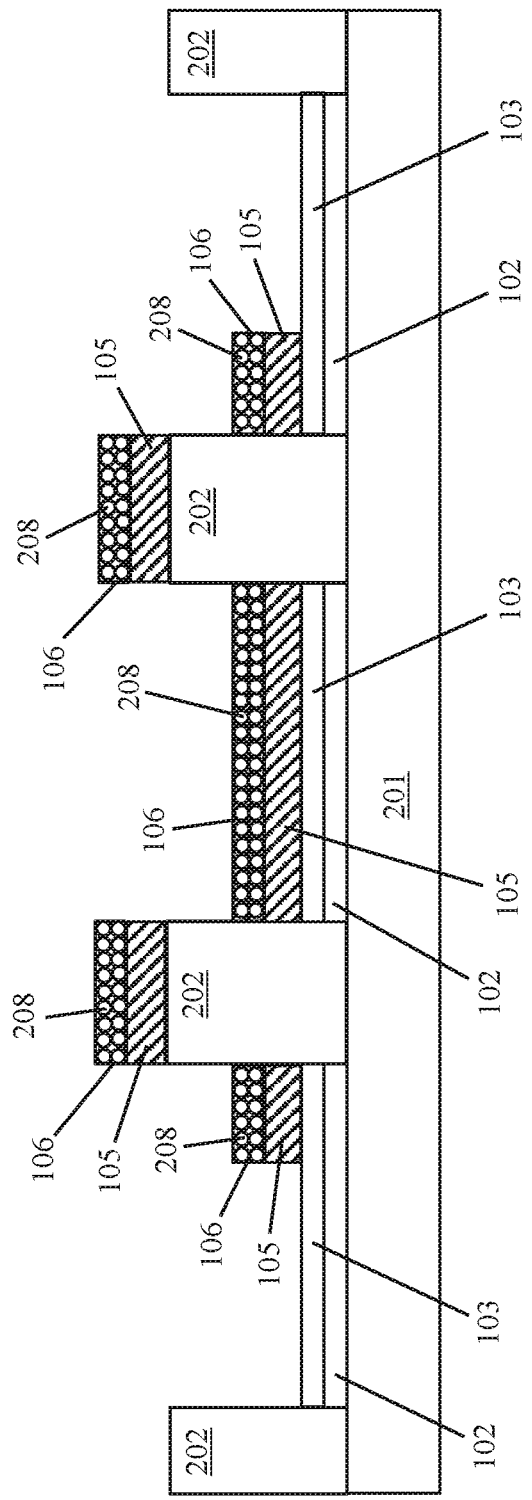
FIG. 8 illustrates a cut-away view of a sub-pixel extending outside the bounds of a sub-pixel defining layer and into adjacent sub-pixels, in accordance with an exemplary implementation of the present disclosure.

Referring to FIG. 8, in the case that the emission spectrum of the quantum dot 301 (FIG. 6) includes wavelengths of light in the photoinitiator absorption coefficient 304 (FIG. 7) such as blue light 305 (FIG. 7), the resulting emissive layer 106 after the photolithography process may extend outside the bounds of a sub-pixel defining layer and into adjacent sub-pixels. This compares unfavorably to the layering shown in FIG. 4, and deleteriously decreases the color purity of the final display, reducing the achievable color gamut. In general, only blue light 305 (FIG. 7) is implicated in this effect. In cases in which the emission spectrum of the quantum dot 301 (FIG. 6) includes only wavelengths of light which the photoinitiator does not absorb, such as green light 306 and red light 307 (FIG. 7), the resulting emissive layers will be correctly patterned as shown in FIG. 5.

Figure 9:
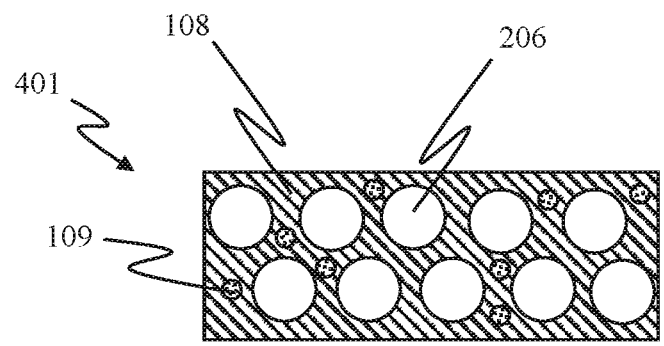
FIG. 9 illustrates a red emissive layer photoresist with photoinitiator, in accordance with an exemplary implementation of the present disclosure.
Figure 10:
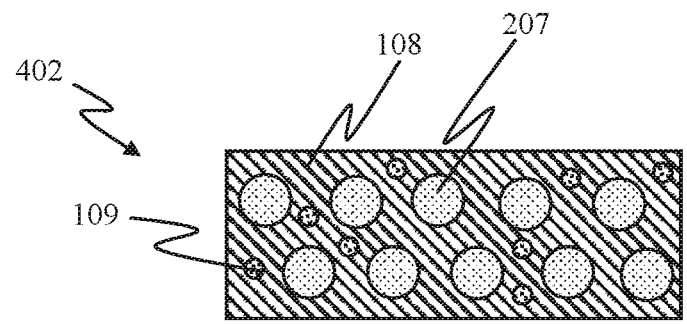
FIG. 10 illustrates a green emissive layer photoresist with photoinitiator, in accordance with an exemplary implementation of the present disclosure.
Figure 11:
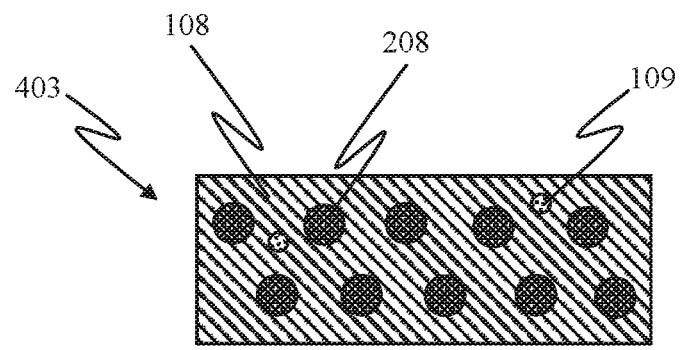
FIG. 11 illustrates a blue emissive layer photoresist with reduced photoinitiator, in accordance with an exemplary implementation of the present disclosure.

Referring to FIGS. 9-11, in one implementation, a QLED display with high color purity may be fabricated by photolithography as follows: With reference to FIGS. 9 and 10, the red emissive layer photoresist 401 and the green emissive layer photoresist 402 for the red and green sub-pixels may be fabricated according to the implementations described previously. With reference to FIG. 11, the photoinitiator 109 concentration in the blue emissive layer photoresist 403 of the blue sub-pixel is changed with respect to the red emissive layer photoresist 401 of the red sub-pixel and green emissive layer photoresist 402 of the green sub-pixel. Specifically, the quantity of photoinitiator 109 included in the blue emissive layer photoresist 403 for the blue sub-pixel is reduced. Preferably, the concentration of photoinitiator 109 in the blue emissive layer photoresist 403 is at least five times lower than the concentration of photoinitiator 109 in either the red emissive layer photoresist 401 or green emissive layer photoresist 402. More preferably, the concentration of photoinitiator 109 in the blue emissive layer photoresist 403 is at least ten times lower than the concentration of photoinitiator 109 in either the red emissive layer photoresist 401 or green emissive layer photoresist 402.

Not all of the photoinitiator 109 will necessarily be used during the photolithography process. Therefore, after the photolithography process, a hole transport layer (e.g., 105 in FIG. 1) and an emissive layer (e.g., 106 in FIG. 1) will still contain quantities of the unused photoinitiator 109. Like the photoresist, the concentration of the photoinitiator 109 in the final cured layers is preferably five times lower in the blue sub-pixel than the red or green sub-pixels. More preferably, the concentration of the photoinitiator 109 in the final cured layers is ten times lower in the blue sub-pixel than the red or green sub-pixels.

Figure 12:
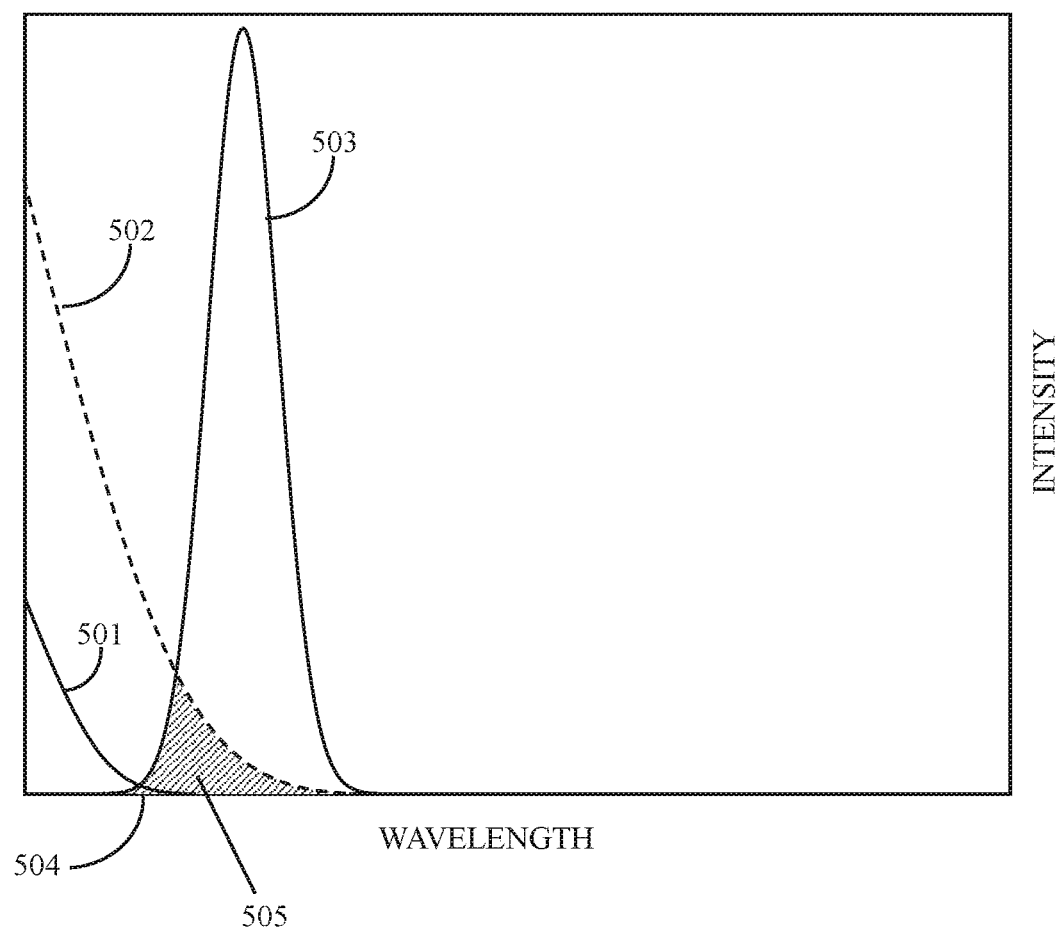
FIG. 12 illustrates a graph comparing a blue photoresist photoinitiator absorption spectrum with a red and green photoresist photoinitiator absorption spectrum, in accordance with an exemplary implementation of the present disclosure.

Referring to FIG. 12, an alternative implementation is shown, with reduced photoinitiator sensitivity to blue light in the blue sub-pixel. This is achieved by using a photoinitiator 109 (FIG. 11) for the blue photoresist that has a lower absorption coefficient 501 compared to a photoinitiator 109 (FIGS. 9, 10) having a conventional absorption coefficient 502 (e.g., used for the red photoresist and the green photoresist). The lower absorption coefficient 501 causes a reduced overlap 504 with the blue quantum dot wavelength region 503, compared to the conventional overlap 505 of the spectrum of the light emitted in the blue quantum dot wavelength region 503 with a photoinitiator 109 having a conventional absorption coefficient 502. Advantageously, this produces a blue sub-pixel with an emissive layer which does not extend outside the boundaries of the bank, thereby resulting in a display with high color purity.

Still referring to FIG. 12, decreasing the absorption coefficient (e.g., the absorption sensitivity) in the blue quantum dot emission wavelength region 503 by using a photoinitiator 109 (FIG. 11) with a lower absorption coefficient 501 may also decrease the absorption by the photoinitiator 109 in the ultraviolet region of the spectrum. Therefore, a shorter wavelength of light may be used in the exposure step of the photolithography process. For example, 365 nm light from a UVA LED, filtered mercury lamp or filtered xenon lamp may be used for exposing the emissive layers of the red and green sub-pixels. In contrast, for exposing the emissive layers of a blue sub-pixel, exemplary light sources may include; a deep ultraviolet LED emitting light with a peak wavelength between 240 nm and 300 nm, the 254 nm emission line from a mercury lamp, the emission between 297 nm and 334 nm from a mercury lamp, a filtered xenon lamp or a filtered deuterium lamp.

Figure 13:
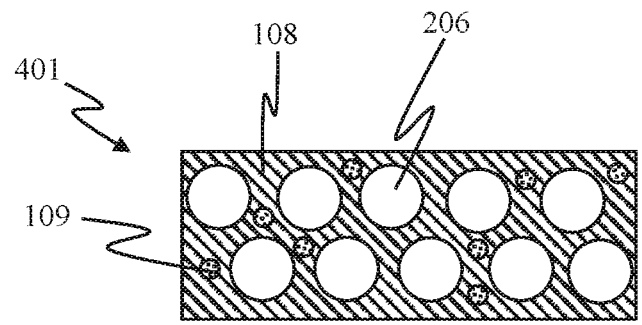
FIG. 13 illustrates an alternative implementation red emission layer photoresist, in accordance with an exemplary implementation of the present disclosure.
Figure 14:
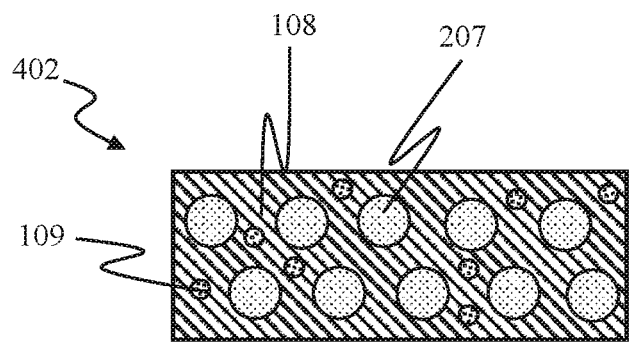
FIG. 14 illustrates an alternative implementation green emission layer photoresist, in accordance with an exemplary implementation of the present disclosure.
Figure 15:
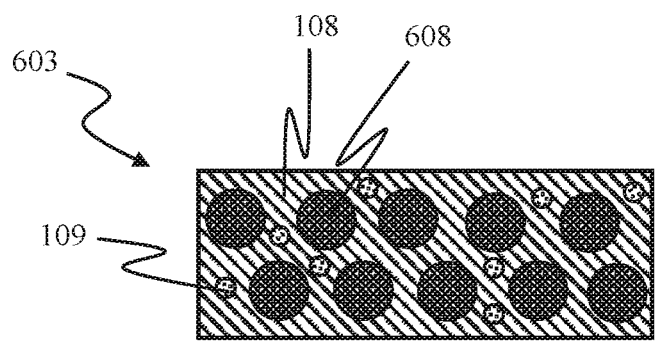
FIG. 15 illustrates an alternative implementation blue emission layer photoresist, in accordance with an exemplary implementation of the present disclosure.

Referring to FIGS. 13-15, in another alternative implementation, quantum dots having a different size may be employed in the blue sub-pixels relative to the red and green sub-pixels. The implementations shown in FIGS. 13 and 14 correspond to those shown in FIGS. 11 and 12, with red quantum dots 206, and green quantum dots 207, respectively, in a hole transport material 108. In the implementation shown in FIG. 15, however, the hole transport material 108 of the blue emissive layer photoresist 603 includes large quantum dots 608 which have an increased size, relative to the red quantum dot photoresist 401, and the green quantum dot photoresist 402. Large quantum dots 608 with a core size and material suitable for emitting the desired blue wavelength of light, and a thick shell, may be included in the blue quantum dot photoresist 603 used for depositing the blue emissive layer. $Cd_xZn_{1-x}Se$ (0≤x<1) and $ZnSe_yTe_{1-y}$ (0<y≤1) are examples of suitable materials for the quantum dot 608 cores. $Cd_xZn_{1-x}Se_yS_{1-y}$ (0≤x≤1; 0≤y<1) is an example of a suitable shell material. The composition of the large quantum dots 608 may vary continuously as a function of distance from the center of the large quantum dot 608 within the core, within the shell or between the core and the shell.

Increasing the size of the quantum dot increases its surface area. Organic ligands are attached to the surface of the quantum dots to passivate surface defects and increase the efficiency of conversion of excitons (electron-hole pairs) into photons. These ligands may contain functional groups which interfere with the crosslinking of the photoresist during the photolithography process. An increased concentration of ligands may advantageously terminate the cross-linking process which is initiated by blue light which is re-emitted by blue quantum dots during the photolithography process, thereby decreasing the probability that the emissive layer extends outside of the pixel defining layer as shown in FIG. 8.

What is claimed is:

1. A quantum dot light emitting diode (LED) display apparatus, comprising:
    a substrate having a plurality of banks deposited thereon; and
    a plurality of red emitting LED sub-pixels, green emitting LED sub-pixels, and blue emitting LED sub-pixels individually disposed between the banks;
    each of the red emitting LED sub-pixels, each of the green emitting LED sub-pixels, and each of the blue emitting LED sub-pixels having an emissive layer;
    wherein each of the emissive layers comprises quantum dots, an organic matrix, and a photoinitiator; and
    wherein a first concentration of the photoinitiators in the blue emitting LED sub-pixel emissive layers is lower than a second concentration of the photoinitiators in the red emitting LED sub-pixel emissive layers, and lower than a third concentration of the photoinitiators in the green emitting LED sub-pixel emissive layers.

2. The quantum dot LED display apparatus of claim 1, wherein the photoinitiators in the blue emitting LED sub-pixels have a lower absorption coefficient for blue light with a wavelength between 400 nm and 500 nm than the photoinitiators in the red emitting LED sub-pixels and the photoinitiators in the green emitting LED sub-pixels.

3. The quantum dot LED display apparatus of claim 1, wherein absorption wavelengths of the photoinitiators in the blue emitting LED sub-pixels are in an ultraviolet wavelength range of 200 nm to 400 nm.

4. The quantum dot LED display apparatus of claim 1, wherein the quantum dots in the blue emitting LED sub-pixels have the same or a greater surface area relative to the quantum dots in the green emitting LED sub-pixels.

5. The quantum dot LED display apparatus of claim 1, wherein the quantum dots in the blue emitting LED sub-pixels comprise a core of $Cd_xZn_{1-x}Se$ (0≤x<1) or $ZnSe_yTe_{1-y}$ (0<y≤1).

6. The quantum dot LED display apparatus of claim 1, wherein the quantum dots in the blue emitting LED sub-pixels comprise a shell of $Cd_xZn_{1-x}Se_yS_{1-y}$ (0≤x≤1; 0≤y<1).

7. The quantum dot LED display apparatus of claim 1, wherein the organic matrix comprises a cross-linked charge transport material.

8. The quantum dot LED display apparatus of claim 1, further comprising one or more second electrodes forming a continuous layer common to all of the red emitting LED sub-pixels, the green emitting LED sub-pixels, and the blue emitting LED sub-pixels.

9. The quantum dot LED display apparatus of claim 1, further comprising one or more first charge transport layers in the red emitting LED sub-pixels, the green emitting LED sub-pixels, and the blue emitting LED sub-pixels.

10. The quantum dot LED display of claim 9, wherein the one or more first charge transport layers in the red emitting LED sub-pixels, the one or more first charge transport layers in the green emitting LED sub-pixels, and the one or more first charge transport layers in the blue emitting LED sub-pixels have different thicknesses.

11. The quantum dot LED display apparatus of claim 1, further comprising one or more second charge transport layers disposed over the emissive layers.

12. The quantum dot LED display apparatus of claim 11, wherein the one or more second charge transport layers are common to all of the red emitting LED sub-pixels, the green emitting LED sub-pixels, and the blue emitting LED sub-pixels.

13. The quantum dot LED display apparatus of claim 1, further comprising a reflector between the substrate and a plurality of first electrodes, wherein one or more second electrodes are partially transmissive such that light emitted towards the one or more second electrodes is transmitted therethrough.

14. The quantum dot LED display apparatus of claim 13, wherein the one or more second electrodes are common to all of the red emitting LED sub-pixels, the green emitting LED sub-pixels, and the blue emitting LED sub-pixels.

15. The quantum dot LED display apparatus of claim 1, further comprising a plurality of partially transmissive first electrodes and one or more reflective second electrodes, wherein light emitted towards the partially transmissive first electrodes passes through the substrate.

16. The quantum dot LED display apparatus of claim 15, wherein the one or more reflective second electrodes are common to all of the red emitting LED sub-pixels, the green emitting LED sub-pixels, and the blue emitting LED sub-pixels.

\* \* \* \* \*